(12) United States Patent
Juneau et al.

(10) Patent No.: US 8,222,965 B1
(45) Date of Patent: Jul. 17, 2012

(54) RADIO FREQUENCY MODULATOR

(75) Inventors: Thor Nelson Juneau, Menlo Park, CA (US); Mark Alan Lemkin, Berkeley, CA (US)

(73) Assignee: Dust Networks, Inc., Hayward, CA (US)

( * ) Notice: Subject to any disclaimer, the term of this patent is extended or adjusted under 35 U.S.C. 154(b) by 15 days.

(21) Appl. No.: 12/877,732

(22) Filed: Sep. 8, 2010

Related U.S. Application Data

(60) Provisional application No. 61/276,970, filed on Sep. 18, 2009.

(51) Int. Cl.
*H03C 3/06* (2006.01)
*H03L 7/08* (2006.01)

(52) U.S. Cl. ............... 332/127; 331/1 A; 331/17

(58) Field of Classification Search .......... 332/123, 332/124, 126, 127, 128; 331/16, 17, 179; 327/156; 375/302
See application file for complete search history.

(56) References Cited

U.S. PATENT DOCUMENTS

| | | | |
|---|---|---|---|
| 6,185,411 B1 * | 2/2001 | Gillig et al. | 455/260 |
| 7,012,470 B2 * | 3/2006 | Suzuki et al. | 331/16 |
| 2005/0280473 A1 * | 12/2005 | Puma et al. | 331/16 |
| 2006/0238261 A1 * | 10/2006 | Rhee et al. | 331/16 |
| 2006/0245531 A1 * | 11/2006 | Leonowich et al. | 375/376 |
| 2007/0109067 A1 * | 5/2007 | O'Sullivan et al. | 332/127 |

OTHER PUBLICATIONS

Kim et al, "A 44GHz Differentially Tuned VCO with 4 GHz Tuning Range in 0.12 um SOI CMOS",Solid-State Circuits Conference, 2005. Digest of Technical Papers. ISSCC. 2005 IEEE International, pp. 416-607, vol. 1.*

* cited by examiner

*Primary Examiner* — Ryan Johnson
(74) *Attorney, Agent, or Firm* — McDermott Will & Emery LLP

(57) ABSTRACT

A modulator for modulating a radio frequency signal comprises a voltage controlled oscillator, a first feedback path, and a second feedback path. The first feedback path is coupled between a detector output and the voltage controlled oscillator. The second feedback path is coupled between the detector output and the voltage controlled oscillator. The detector is coupled to a divided down output of the voltage controlled oscillator and a reference clock.

23 Claims, 16 Drawing Sheets

RADIO FREQUENCY MODULATOR

CROSS REFERENCE TO OTHER APPLICATIONS

This application claims priority to U.S. Provisional Patent Application No. 61/276,970 entitled RADIO FREQUENCY MODULATOR filed Sep. 18, 2009, which is incorporated herein by reference for all purposes.

BACKGROUND OF THE INVENTION

Typical modulation circuitry for radio transmitters uses substantial power to accurately modulate a radio frequency (RF) output signal due to architectural techniques used. One type of radio modulator uses in-phase-(I) and quadrature-(Q) digital-to-analog converters (DACs) with dual mixers to modulate the desired signal. In this type of modulator the mixers directly mix the input signal to the RF output frequency, or an intermediate frequency (IF) which is later mixed to the final RF value. In addition to being high power, this type of architecture is susceptible to voltage controlled oscillator (VCO) pulling which causes undesirable signal distortion. Another type of modulator uses a fractional-N phase lock loop (PLL) to directly modulate the VCO. However, the signal processing circuitry for the fractional-N based modulation is substantial due to the high-speeds at which the modulator must operate.

BRIEF DESCRIPTION OF THE DRAWINGS

Various embodiments of the invention are disclosed in the following detailed description and the accompanying drawings.

DETAILED DESCRIPTION

Figure 1:
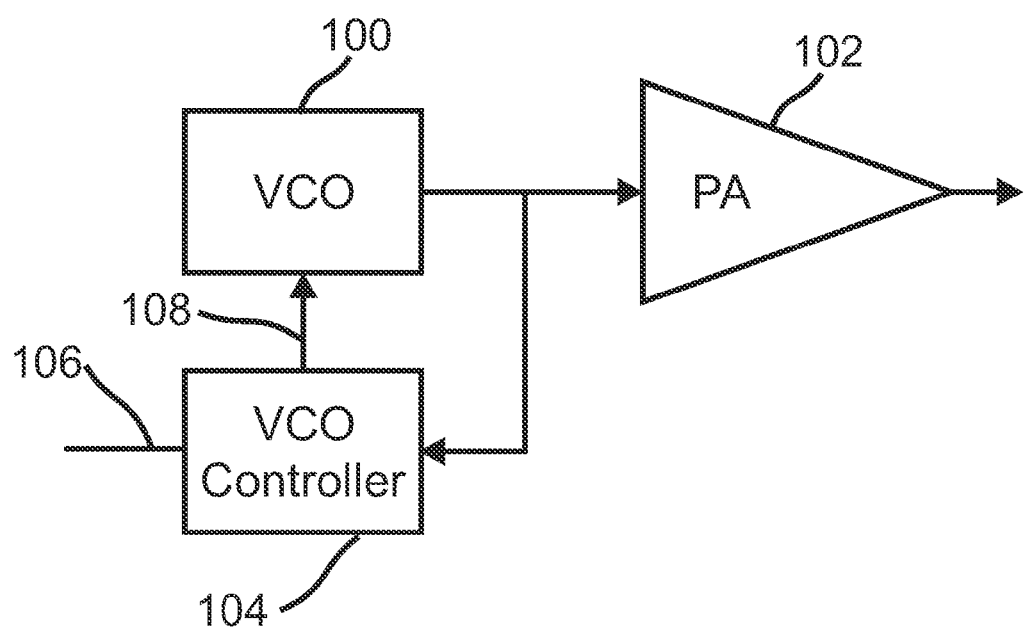
FIG. 1 is a block diagram illustrating an embodiment of a modulator.

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A modulator is disclosed. In some embodiments, a modulator is used to provide modulation of a radio-frequency (RF) output signal. In some embodiments, a modulator is used to modulate an input data stream into an institute of electrical and electronic engineers (IEEE) 802.15.4-compliant RF output signal via a connection between the modulator voltage controlled oscillator (VCO) and an amplifier. In some embodiments, the input data stream comprises chips or bits, which for the remainder of this description are used interchangeably to mean a piece of data that is desired to be modulated.

In some embodiments, a modulator comprises a VCO and two feedback loops. The first feedback loop provides feedback to a first set of varactors to drive the VCO to the desired channel center. A second set of varactors is used for modulation of the data; data is modulated by changing a voltage on the second set of varactors in response to a desired input-data chip stream. A second feedback loop measures the response of the VCO to the input data, compares this response with a reference, and provides feedback to a voltage on the second set of varactors to achieve desired modulation characteristics. In various embodiments, modulation characteristics comprises one or more of the following: binary frequency-shift keying (2-FSK), multiple frequency-shift keying (MFSK), minimum-shift keying (MSK), Gaussian frequency-shift keying (GFSK), phase-shift keying (PSK), orthogonal quadrature phase shift keying O-QPSK, quadrature amplitude modulation (QAM), or any other appropriate modulation characteristic. In some embodiments, modulation characteristics characterize a modulation around a center channel frequency.

FIG. 1 is a block diagram illustrating an embodiment of a modulator. In the example shown in FIG. 1, voltage-controlled oscillator (VCO) 100 is coupled to power amplifier (PA) 102. VCO controller 104 compares the frequency of VCO 100 to a reference frequency input 106 and adjusts a capacitance within VCO 100 via controller output 108 to bring a frequency of a VCO versus time characteristic closer to desired. In some embodiments, the capacitance within VCO 100 is varied by adjusting a voltage on one or more terminals of a varactor, such as a MOS varactor or a P-N junction varactor. In some embodiments, the capacitance within VCO 100 is varied by changing the value of a switch that switches a capacitor to a resonant tank comprising an inductor. In various embodiments, VCO 100 comprises a LC resonant tank, a relaxation oscillator, a quartz crystal oscillator, a MEMS resonator, or any other appropriate oscillator. In some embodiments, PA 102 outputs a power between 0.1 mW and 1 W into a 50 ohm load.

In some embodiments, the modulator provides substantially reduced transmitter current due to reduced power consumption by component circuit blocks. In some embodiments, the modulator provides substantially reduced transmitter current due to the direct drive of an amplifier by VCO 100. Direct drive of an amplifier such as an RF power amplifier by a VCO enables a large signal swing to be provided to the amplifier with low power since the VCO has substantial swing; furthermore, input capacitance from the amplifier may be lumped in to the VCO tank capacitance and thereby be largely tuned out. In some embodiments, VCO 100 is connected to a buffer or a pre-amplifier before being connected to power amplifier 102. A buffer or pre-amplifier provides increased isolation between VCO 100 and PA 102 thereby reducing disturbances to a frequency of VCO 100 when the amplifier is enabled or the amplifier is connected to an antenna by a switch, for example. In some embodiments, no power amplifier or buffer is present, and the RF output comprises LO leakage. In some embodiments, polar modulation of amplitude and phase is accomplished using the modulator to provide phase modulation in conjunction with amplitude modulation by adjusting the supply or a bias input to a power amplifier. Polar modulation may be used for quadrature-amplitude-modulation (QAM), for example.

In some embodiments, the modulation signal is offset-quadrature phase shift keyed (O-QPSK) with half-sine pulse shaping, which is equivalent to minimum-shift keying (MSK). The MSK format uses two-frequency modulation. In some embodiments, the high frequency codes a data '1' and the low frequency codes a data '0'; in some embodiments, the high frequency codes a data '0' and the low frequency codes a data '1'. A voltage controlled oscillator directly drives a power amplifier that in turn drives the antenna. The Institute of Electrical and Electronics Engineers (IEEE) 802.15.4-2003 specification requires an error-vector magnitude (EVM) of less than 35% RMS. Note that a small modulation deviation error integrated over time quickly integrates to a large phase error. To meet this requirement, MSK modulation must be highly accurate since EVM is dependent on phase error over many data chips. A controller is used to adjust the VCO and modulation to ensure that the phase accuracy of the modulated signal meets EVM requirements.

Figure 2:
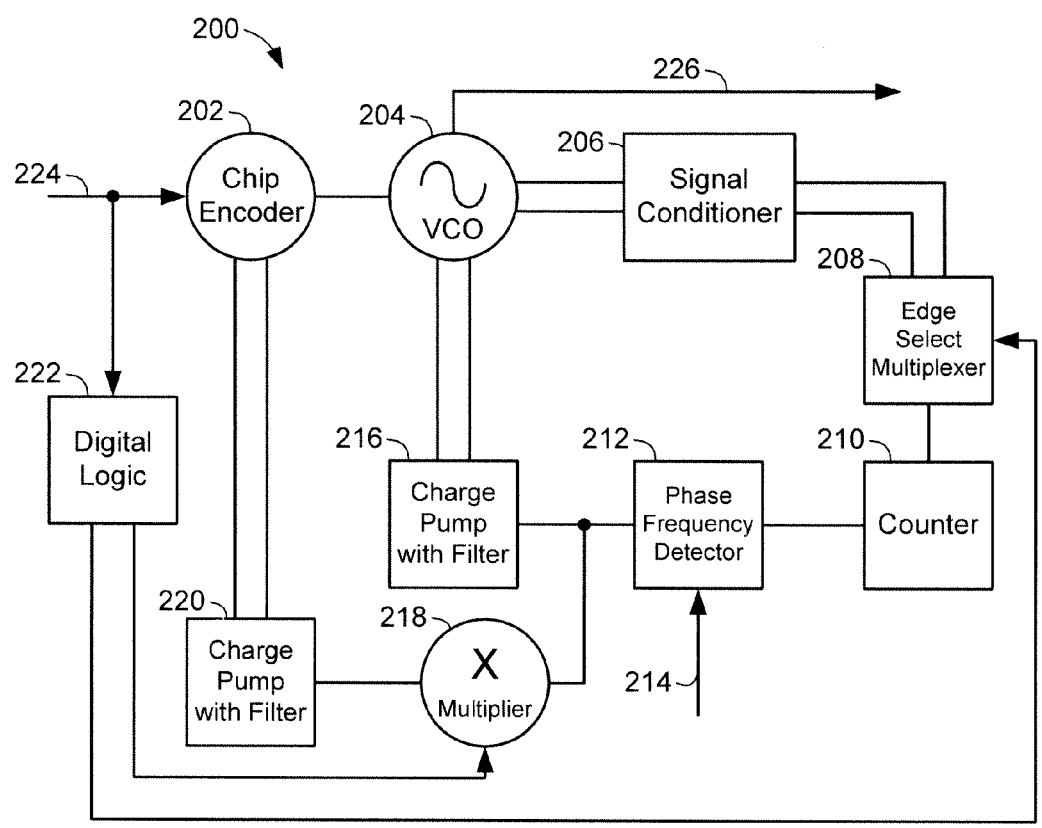
FIG. 2 is a block diagram illustrating an embodiment of a modulator.

FIG. 2 is a block diagram illustrating an embodiment of a modulator. Modulator 200 uses two feedback loops. A first feedback loop comprising signal conditioner 206, edge select multiplexer 208, counter 210, phase frequency detector (PFD) 212, and charge pump with filter 216 stabilizes the channel center frequency. A second feedback loop comprising signal conditioner 206, edge select multiplexer 208, counter 210, phase frequency detector (PFD) 212, multiplier 218, charge pump with filter 220, and chip encoder 202 stabilizes the deviation frequency. PFD 212 compares the output of counter 210 with reference clock input 214. Digital logic 222 analyzes the input chipping sequence 224 and applies the proper input signals to multiplier 218 and multiplexer 208. In some embodiments, logic 222 provides different digital values to multiplier 218 than it provides to multiplexer 208 as is necessary for proper operation of the modulator. Stabilization of the channel center frequency may be thought of as a common-mode feedback, while stabilization of the deviation frequency may be thought of as a differential-mode feedback. In some embodiments, a first set of varactors is used to tune the common-mode frequency. A second set of varactors is used to tune the differential mode. In some embodiments, the common-mode varactors are larger in value than the differential-mode varactors. Making the difference varactor small reduces the differential-mode susceptibility to control voltage noise, power supply noise, and other disturbance sources. In some embodiments, error vector magnitude is more susceptible to errors in deviation than errors in carrier frequency. Note that by having a separate channel-center loop and a deviation loop, the deviation frequency will be largely independent of disturbances in the common mode. Furthermore, decoupling the control loops allows independent bandwidth control for the two loops and can provide improved overall settling.

Figure 3A:
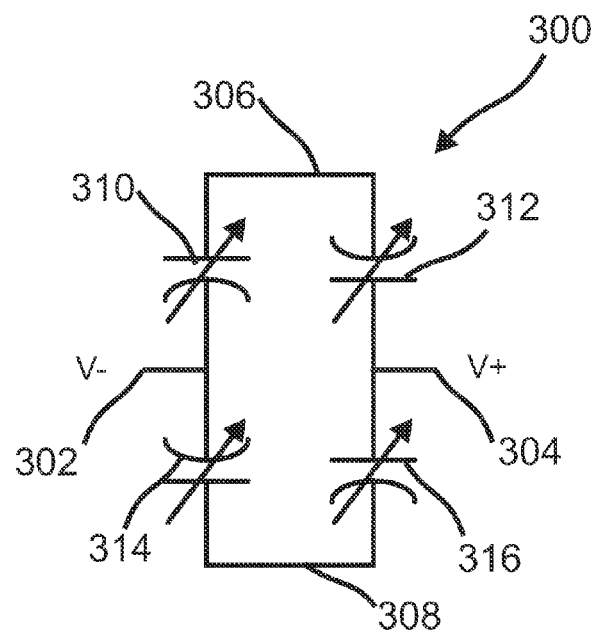
FIG. 3A is a schematic diagram illustrating an embodiment of a differential varactor with differential input and differential output.

FIG. 3A is a schematic diagram illustrating an embodiment of a differential varactor 300 with differential inputs 302 and 304 and differential outputs 306 and 308. Differential output 306 and 308 is connected in parallel with an inductor that is part of a LC oscillator and is used to modulate chips. LC-based oscillator circuit topologies are various and well-known by those skilled in the art. In some embodiments, differential output is connected to nodes in a relaxation oscillator. Nodes 306 and 308 have a voltage with substantially constant DC value even though the voltages at these nodes may have large sinusoidal or AC amplitudes. In some embodiments, nodes 306 and 308 are maintained at about half the operating supply voltage via two resistors coupled to these two nodes. Varactors 310, 312, 314, and 316 are MOS varactors with the top plate representing the gate terminal and the bottom plate representing the junction terminal located in the substrate. In some embodiments, P-N junction varactors are used.

Figure 3B:
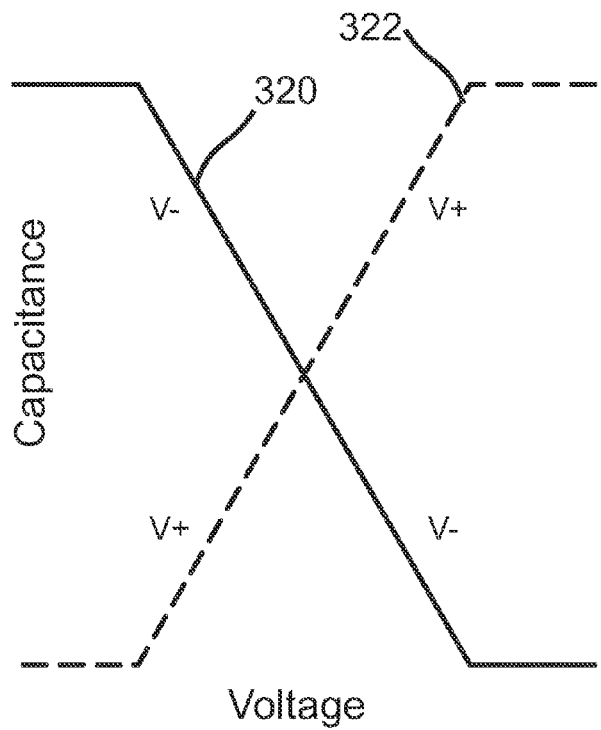
FIG. 3B is a graph of a capacitance versus voltage characteristic associated with the differential varactor embodiment shown in FIG. 3A.

FIG. 3B is a graph of a capacitance versus voltage characteristic associated with the differential varactor embodiment shown in FIG. 3A. In the example shown in FIG. 3B, capacitance 320, which represents the series capacitance of 310 and 314 decreases as the voltage is increased at node 302. On the other hand, capacitance 322, which represents the series capacitance of 312 and 316 increases as the voltage is increased at node 304. Thus if 302 and 304 represent the outputs of a differential circuit, such as a differential charge pump filter the total capacitance across 306 and 308, which is the sum of 320 and 322, is insensitive to common mode disturbances to first order. The differential varactor of FIG. 3 has good attenuation of charge pump offset errors due to the voltage versus capacitance characteristic. The differential varactor of FIG. 3A also has the advantage that it is monotonic over an extended operating input voltage range. Non-monotonicity can arise in varactors due to nonlinearities in the capacitance-voltage characteristic. Monotonicity is beneficial in feedback control systems such as a modulator since non-monotonic elements can cause instability or convergence to an undesired operating point during operation if the feedback polarity is switched as the varactor operating range changes.

In some embodiments, coding in chip encoder 202 is accomplished by chopping, or multiplexing, the control voltage output of 220 between two pairs of varactors located within chip encoder 202. In some embodiments, chip encoder 202 includes four varactors arranged as in FIG. 3A with coding accomplished by switching the connections between a differential output of 220 with 302 and 304 such that the output voltage between 302 and 304 varies between a positive voltage in one configuration and a negative voltage in a second configuration. This switching occurs at the chip rate, and is controlled by the modulator input 224.

In some embodiments, the differential control loop doesn't modulate the chips themselves, but rather adjusts the magnitude of the deviation frequency. Modulation is accomplished by switching the difference-frequency varactors between a first voltage to modulate the positive frequency and a second voltage to modulate the negative frequency. In some embodiments, the first and second voltages are derived by chopping the outputs of a filtered charge pump. In some embodiments, the first voltage is ground or VSS and the second voltage is the supply rail or VDD. In some embodiments, to provide accurate modulation trajectories, switching between the first and second voltage is accomplished using a low-impedance switch so that the transition between the two voltages at the varactors occurs rapidly. The polarity of the switching is as required to maintain the proper polarity of the feedback loops and modulation polarity. The rate of switching dictates the chip rate. Since the control loops control the deviation and center frequency, the bandwidth of these loops can be very slow as compared to the chip rate. In some embodiments the control loops operate below about 50 kHz, since, after the loops have settled, the control loops only need to provide disturbance rejection during modulation and the disturbances the modulator must reject during transmission are typically relatively slow, for example charge leakage and temperature drift.

Figure 4:
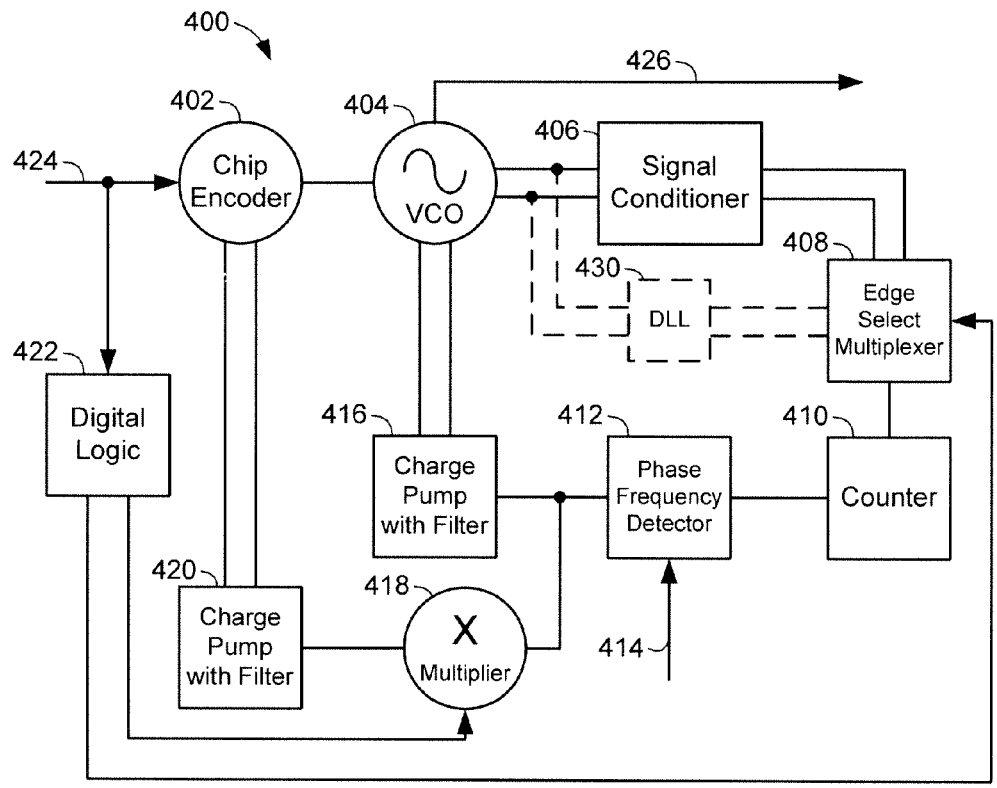
FIG. 4 is a block diagram illustrating an embodiment of a modulator.

FIG. 4 is a block diagram illustrating an embodiment of a modulator. In some embodiments, the elements of FIG. 4 correspond to elements of FIG. 2. In the example shown, the control loops operate at an update rate $f_s$ which is a lower rate than the chip rate. In various embodiments, the chip rate and control loop rate are at the same frequency, different frequencies, operate in a continuous-time fashion, or any other appropriate operating manner. Each control loop comprises a phase-locked loop (PLL). A PLL controls the phase of one signal by comparison to a reference signal. In some embodiments, reference signal 414 comprises a 1 MHz clock. The feedback signal which is output from counter 410 and fed into phase frequency detector (PFD) 412 is VCO 404 divided down by a channel- and data-dependent divider. Phase frequency detector 412 compares the feedback- and reference-signal phase and produces a positive output for phase lead and negative output for phase lag. In some embodiments, a phase detector is used instead of PFD 412. Two charge pumps with filters 416 and 420 use this PFD signal to either add charge or remove charge from capacitors. In some embodiments, the charge pump comprises a positive and a negative transistor current source and switches between the two current sources and an output node. In some embodiments, the filter connected to the charge pump (e.g., a filter contained within 416 or a filter contained within 420) comprises a second order filter with a compensation zero built using two capacitors and a resistor. A second order filter with a compensation zero built using two capacitors and a resistor may be constructed with a first capacitor in parallel with an R-C circuit comprising a second capacitor and a resistor in series with the second capacitor. In various embodiments, the filter is passive; the filter is active and uses a single-ended opamp; the filter is active and uses a differential opamp, or any other appropriate filter. The common-mode frequency charge pump and filter 416 closes a negative feedback loop. Since the differential-mode controller stabilizes the difference frequency, the output of PFD 412 is multiplied by +1 or −1 in multiplier 418 depending on the transmitted chip pairs. The charge pumps with their filters hold the voltages used to control the VCO.

In some embodiments, the output of PFD 412 has two digital outputs: up and down and multiplier 418 comprises a multiplexer to switch the output polarity so that in a first state up is connected to a positive input of filter 420 and down is connected to a negative input of filter 420 and in a second state up is connected to a negative input of filter 420 and down is connected to a positive input of filter 420. In some embodiments, the output of PFD 412 has four outputs: up, up bar, down and down bar and multiplier 418 comprises a multiplexer to switch the output polarity so that up and down are commutated going from a first state to a second state and up bar and down bar are commutated going from this same first state to the same second state.

Figure 5:
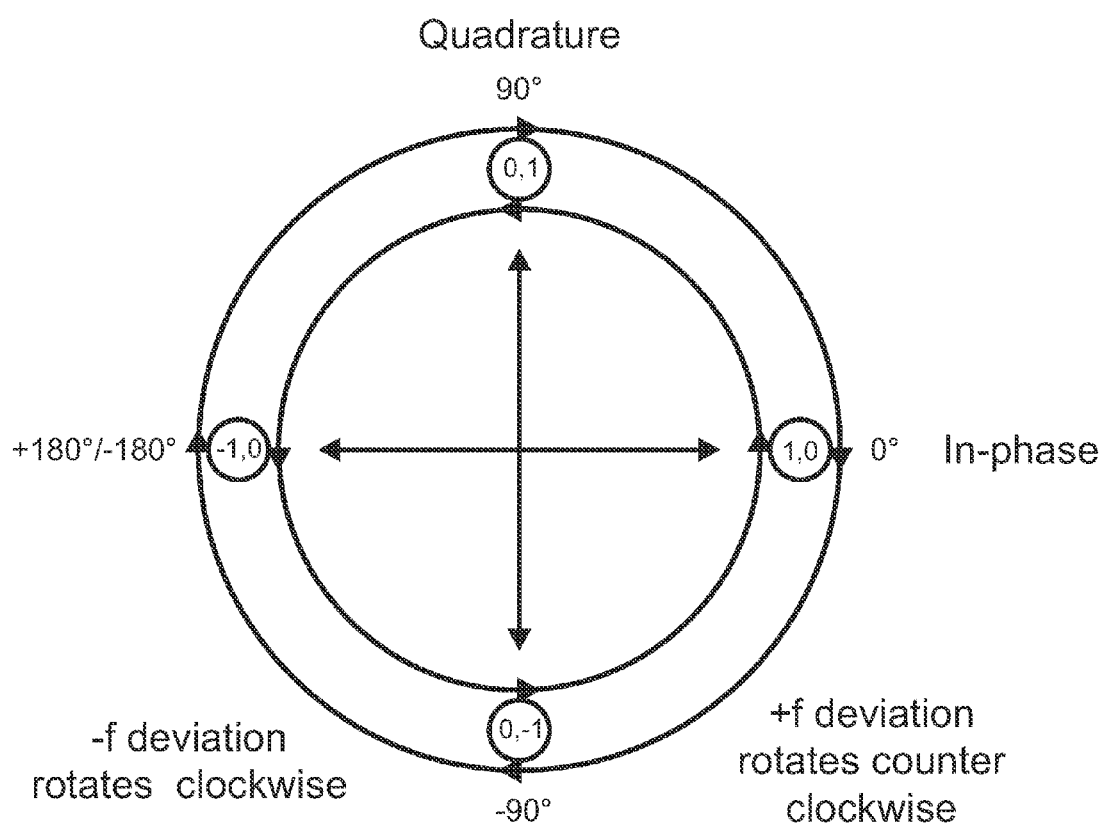
FIG. 5 is a diagram illustrating an embodiment of an I-Q constellation plot.

FIG. 5 is a diagram illustrating an embodiment of an I-Q constellation plot of O-QPSK with half-sine pulse shaping. FIG. 5 may be used to illustrate how PFD measurements provide feedback to the differential-mode and common-mode loops. In the example shown, the reference frequency is at 1 MHz, the chip rate is 2 Mcps, and chips are taken pairwise and analyzed for where the LO phasor should be after the pairwise transition. Note that when taken pairwise all possible chip sequence pairs [00, 01, 10, or 11] result in ideally either zero net phasor rotation or an ideal net phasor rotation of +/−180 degrees. In this discussion numerals inside square brackets represent one or more chips and numerals inside parentheses represent coordinates on an I-Q constellation diagram. As an example, assume that the desired chip stream is a 2 Mcps MSK data stream equal to [1, 0, 0, 0, 1, 1], an ideal 0 corresponds to a 90-degree clockwise rotation, and that an ideal 1 corresponds to a 90-degree counterclockwise rotation. Furthermore, for illustrative purposes to aid in teaching, assume that the channel center frequency is initially 20 kHz high and that the deviation is initially +/−400 kHz instead of an ideal +/−500 kHz as specified by IEEE 802.15.4. If we start at position (1,0), where (1,0) represents the location of the phasor on the I-Q constellation, the first chip pair [1,0] ideally transitions the phasor first to +90 degrees (0,1), then back to 0 degrees (1,0) in time for the reference edge detect. Since the channel center frequency is 20 kHz high, the phasor will have rotated 20 kHz*360 degrees*1 us=7.2 degrees counterclockwise over this two-chip period (+7.2 degrees). Because the deviation applied during the first and second chips are of opposite sign but equal magnitude the effect of the magnitude of the deviation error is removed to first order and the phase error output of the PFD represents the error due to the channel center frequency error. This error, represented by a PFD output pulse causes the common-mode charge pump to adjust the charge-pump voltage to bring the VCO closer to the channel-center frequency, in this case lowering the VCO frequency. In some embodiments, a multiplier (e.g., multiplier 418) multiplies a PFD (e.g., PFD 412) output by zero when no differential information is included in the PFD output. In some embodiments, a multiplier (e.g., multiplier 418) multiplies a PFD (e.g., PFD 412) output by 1 or −1 when the two chip sequence is [0,1] and [1,0] respectively. In some embodiments, a multiplier multiplies a PFD output by a value that is dependent on two or more chips sent in sequence. Now, taking the next chip pair [0,0] we see that the first chip ideally transitions the phasor first to −90 degrees (0,−1), then to −180 degrees (−1,0) in time for the reference edge detect. The effect of the common-mode frequency error is to add a 7.2 degree counter-clockwise phase error to the phasor, while the effect of the differential-mode error is to rotate the phasor only 144 degrees instead of a full 180, a clockwise shortfall of 36 degrees. Thus, the net error is 36+7.2=43.2 degrees of clockwise error; the phasor now stands at −136.8 degrees from the last position. Since the last position was +7.2 degrees; the phasor position at the end of the fourth chip is −129.6 degrees. Since zero phase error in the system at this point would correspond to 180 degrees on the constellation, the reference clock must be compared to a 180-degree phase shifted version of the VCO by a PFD (e.g., PFD 412). The PFD output error is corrected for sign by a multiplier (e.g., multiplier 418) to provide a signal to the differential-mode charge pump and filter (e.g., filter 420) so that the 50.4 degree shortfall in clockwise rotation from expected will increase the deviation frequency. The 50.4 degree shortfall also feeds back to 416 to lower the common-mode frequency. In some embodiments, switching between comparing the reference clock with the VCO and a 180-degree phase shifted version of the VCO is accomplished by multiplexing a positive VCO output and a negative VCO output to a divider or counter (e.g., counter 410). An embodiment of a differential VCO with a multiplexer is described herein.

The next chip pair is [1,1] which ideally would transition the phasor first to −90 (0,−1), then to 0 degrees (0,0) in time for the reference edge detect if we started at −180 degrees; however, the prior two-chip sequence left the phasor at −129.6 degrees. The effect of the common-mode frequency error is again to add a 7.2 degree counter-clockwise phase error to the phasor, while the effect of the differential-mode error is to rotate the phasor only 144 degrees counter-clockwise instead of 180 degrees. Thus, the net phasor angle shift is 144+7.2=151.2 degrees. However, since the prior two-chip sequence rotated the phasor to only −129.6 degrees the phasor stands at +21.6 degrees. Since zero phase error in the system at this point would correspond to 0 degrees on the constellation, the reference clock is compared to a 0-degree phase shifted version of the VCO by a PFD (e.g., PFD 412). The PFD output error is corrected for sign by multiplier (e.g., multiplier 418) to provide a signal to the differential-mode charge pump and filter (e.g., filter 420) so that the 21.6 degree overshoot in counter-clockwise rotation will decrease the deviation frequency. The 21.6 degree overshoot also feeds back to 416 to lower the common-mode frequency. The common-mode loop utilizes every 1 us update by simply passing the phase error to the charge pump. Thus the first three chip pairs present a charge delta to the common-mode loop corresponding to the following input sequence: +7.2, +50.4,+21.6 where the positive value of the angle error in degrees represents a command for the charge pump to lower the VCO frequency. The command to the differential-mode loop corresponds to the following input sequence: −7.2 (assuming the chip sequence [1,0] corresponds to a −1 command to the multiplier as described above), +50.4, −21.6 where the positive value of the angle error in degrees represents a command for the charge pump to raise the deviation frequency. Even though the differential-mode command has both positive and negative charge pump commands, over time the differential frequency is driven to +/−500 kHz because the average command to the charge pump drives the deviation frequency to the correct value. Likewise the common mode frequency is driven to the desired channel center. Note that the phase errors due to the common-mode and differential-mode errors were assumed constant throughout this example to aid the reader in understanding the teachings (20 kHz high common mode frequency and 20% low deviation frequency). In actuality, the point of the feedback loop is to reduce these errors over time; thus, these errors are driven lower so that the actual phasor rotation more accurately tracks desired phasor rotation over time.

Figure 6:
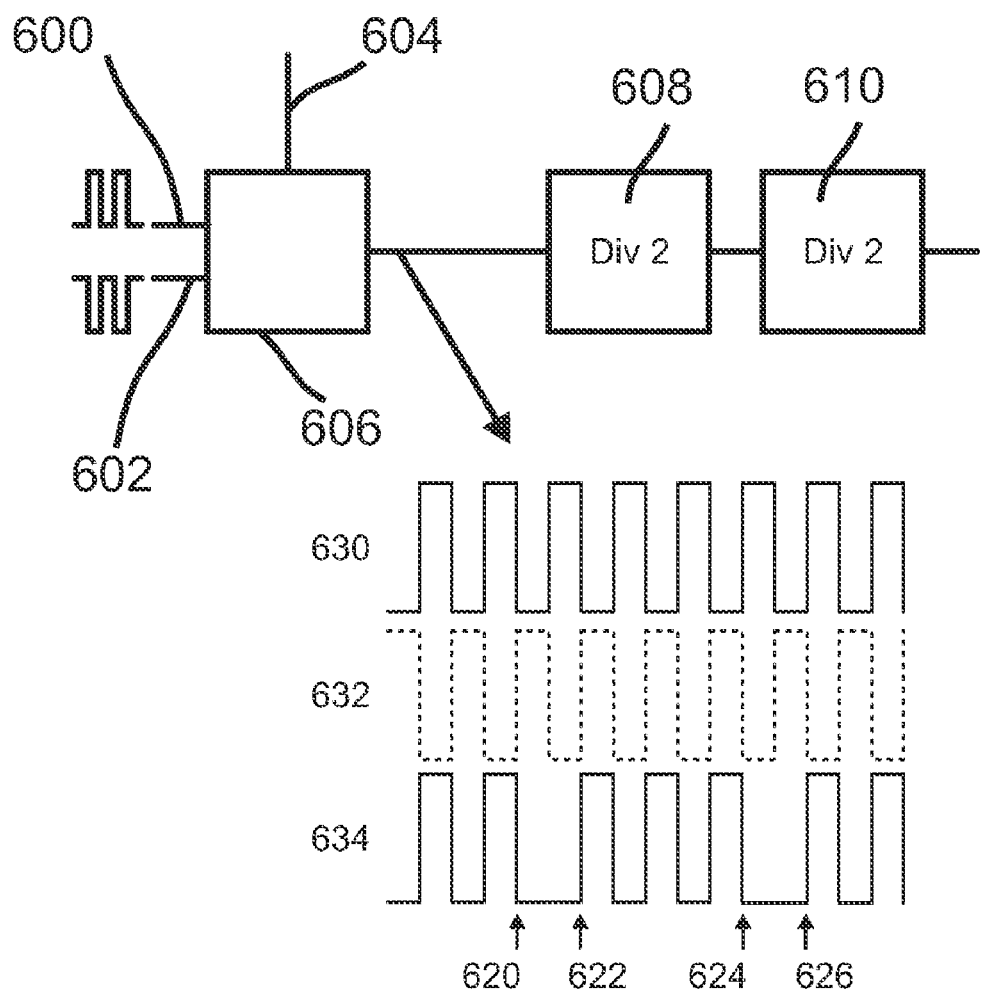
FIG. 6 is a schematic diagram illustrating an embodiment of a multiplexer and dividers.

FIG. 6 is a schematic diagram illustrating an embodiment of a multiplexer and dividers. In some embodiments, multiplexer 606 is similar to 208 or 408 and dividers 608 and 610 are part of a counter similar to 210 or 410. In the example shown, input 600 and input 602 are two signals 180 degrees out of phase coupled to the VCO output. In some embodiments, 600 and 602 are coupled to a duty-cycle stabilizer output, the duty-cycle stabilizer input being coupled to the VCO output. A duty-cycle stabilizer is advantageous when there is a common-mode component to the VCO output since a common-mode component to the VCO output results in the rising edge of one VCO output not being 180 degrees out of phase from the other output. A common-mode component from the VCO may be caused by asymmetric loading, for example loading a single ended PA or buffer amplifier on only one VCO leg; random mismatch; systematic mismatch from inductor asymmetry for example; or for various other reasons. Multiplexer 606 has select input 604 which selects between the input 600 and the input 602. Waveform 630 and 632 show internal nodes of multiplexer 606 corresponding to 600 and 602. When select input 604 goes from high to low or low to high the opposite input is selected. As the opposite edge is selected the output is held low for an extra 180 degrees to avoid glitching. To illustrate the multiplexer, a first select edge causes the output signal 634 of the multiplexer 604 to switch from waveform 630 to waveform 632: at 620 output 634 is aligned with waveform 630, but at 622 output 634 is aligned with 632. Thus, at 622 the VCO edge has been effectively rotated 180 degrees by selecting the opposite VCO phase. A select edge of the opposite polarity switches back so that output 634 is aligned with input 630 again; the transition in the alignment can be seen by looking at points 624 and 626. The second select edge causes the VCO edge to rotate another 180 degrees back to the original phase. Thus, by toggling the select edges back and forth the proper phase for comparison to the reference clock may be selected. Notice that in addition to the phase being shifted as select toggles, the number of rising edges into divider 608 has been reduced by one over the number of edges that would have occurred had there been no activity on the select input. This is because half of a cycle is blanked every time the phase is selected. This behavior may be used in conjunction with the dividers and a downstream counter to adjust the effective divider count ratio of the VCO to the reference clock necessary to properly center the VCO at a channel. Being able to skip VCO pulses by toggling select from one value to another value and back allows the use of one or more divide-by-2 circuits such as 608 or 610 without limiting the possible output frequencies when an integer-N style counter is used. Cascading one or more divide by 2 circuits between the VCO and the counter has substantial power advantages since the high frequency signals to be divided are reduced in frequency as quickly as possible, using a T-type flip-flop for example. As an example, suppose the VCO center frequency was desired to be at 2.405 GHz. If two dividers immediately followed the VCO to divide the VCO frequency by 4 then there would be no way to hit the channel center frequency with a 1 MHz reference with an integer counter: dividing by six-hundred-and-one after the divide by 4 would yield a VCO frequency of 2.404 GHz (since 601*4=2404), dividing by six-hundred-and-two after the divide by 4 would yield a VCO frequency of 2.408 GHz (since 602*4=2408). However, dividing by six-hundred-and-one and toggling the edge high-low-high or low-high-low between the comparison edges of the reference clock will properly center the channel since the VCO is divided by 2404 plus one, the plus one arising from an edge being skipped before the divide by 4 due to the toggling of select. In fact, channel spacing of half the reference frequency can be accomplished by adding increments of one select edge (low-high or hi-low) per reference cycle. In some embodiments, a counter circuit commonly used in integer-N PLLs such as a variable pre-scaler that pre-scales by a number N for F times and pre-scaled by a number N+1 for S times is used to count cycles of a VCO to present to the PFD.

In various embodiments, one or more dividers follow a multiplexer where the dividers divide by 2, 3, 4, or any other appropriate divide value. In some embodiments, the counter comprises a chain of divide-by-2 circuits and a comparator, adjustment to the count value being attained using pulse skipping by select edge toggling.

While following multiplexer 606 by one or more divide circuits can reduce overall system power consumption by lowering the counter clock rate, in some embodiments there are no dividers following multiplexer 606 the output of the multiplexer going directly into a counter.

In some embodiments the VCO is prescaled by a number N for F times and pre-scaled by a number N+1 for S times, the numbers S and F being adjusted from reference clock cycle to reference clock cycle depending on the data being modulated to provide the proper phase comparison point of the VCO to the reference clock.

Figure 7:
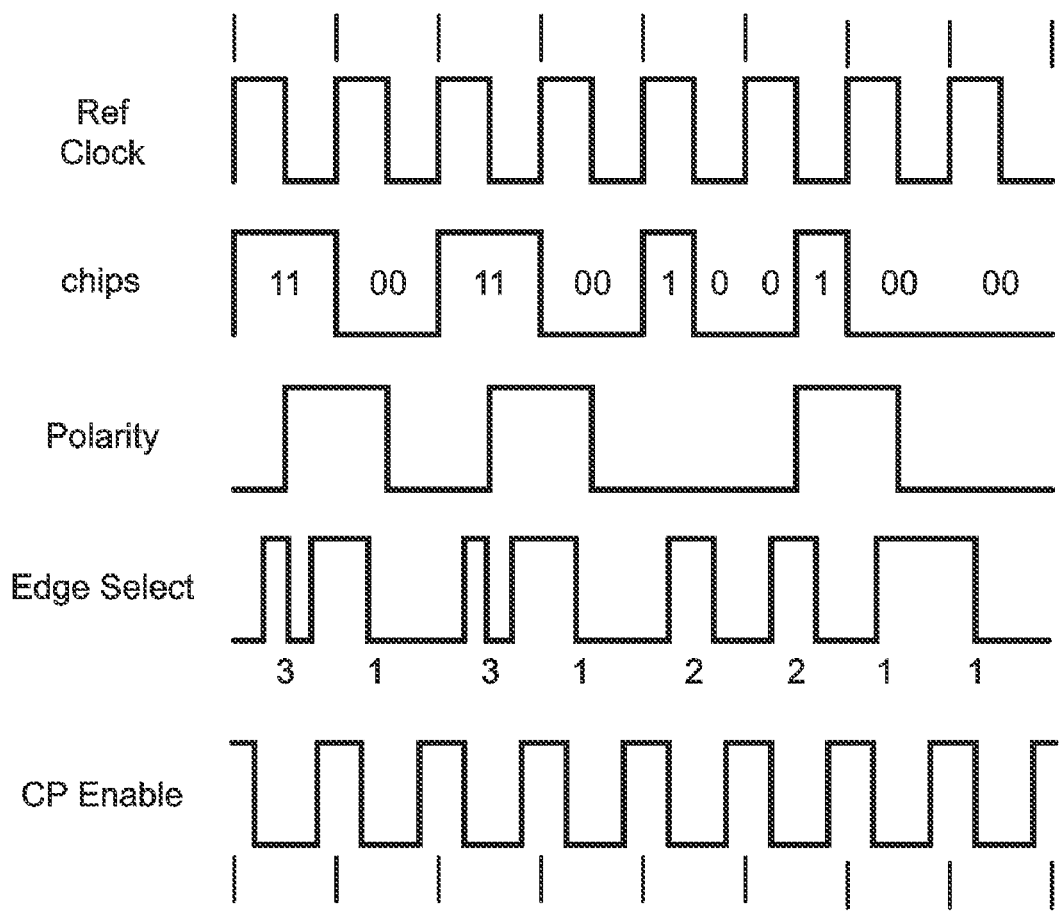
FIG. 7 is a diagram illustrating timing of various signals in an embodiment of a modulator.

FIG. 7 is a diagram illustrating timing of various signals in an embodiment of a modulator. In the example shown in FIG. 7, the reference clock cycles at a rate half the chip rate of the modulator. An illustrative example of a chipping sequence equal to [1,1,0,0,1,1,0,0,1,0,0,1,0,0,0,0] is shown. The polarity of the differential mode feedback path, indicated by Polarity, is switched to correspond with the chip sequence so that when edges are compared by the PFD the proper polarity of feedback is applied. Edge select shows when the multiplexer is switched between the two VCO phases, the number below the waveform corresponding to how many select edges the multiplexer undergoes during the reference clock cycle. In some embodiments, one or more charge pumps are disabled during a time period away from where the PFD performs edge comparisons as illustrated by the waveform CP enable. In some embodiments charge pumps remain enabled during the entire modulation process.

In some embodiments toggling of the edge select signal is spaced evenly throughout the reference clock period. In some embodiments toggling of the edge select signal is grouped about a point in the reference clock period such as the beginning or the end.

Figure 8:
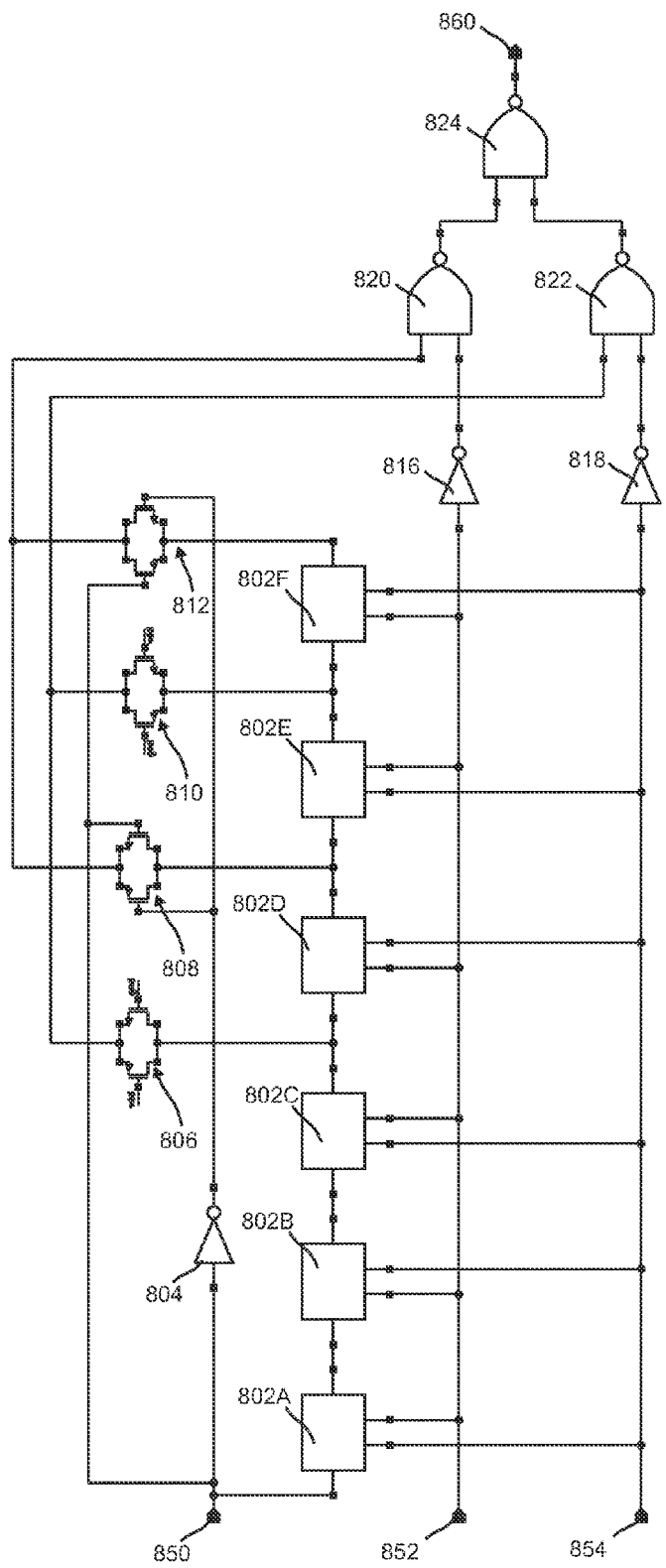
FIG. 8 is a schematic diagram illustrating an embodiment of a multiplexer.

FIG. 8 is a schematic diagram illustrating an embodiment of a multiplexer. In the example shown, inputs 852 and 854 are 180-degree phase shifted signals at RF and may be coupled directly from the VCO, or processed by additional circuits such as a duty-cycle stabilizer. Input 850 selects which input of 852 or 854 is to be presented to the output 860. Inputs 852 and 854 drive clock and clock bar inputs of dynamic latches 802. Latches 802 provide an inverted version of their input when clocked. In some embodiments, latches 802 are static. Select input 850 is sampled by three latches in series (802A, 802B and 802C) to synchronize the edge transition to the inputs 852 and 854. Dummy load 806 is connected to the output of 802C. At the output of 802D pass gate 808 presents the select edge to NAND 820. Note that pass gate 808 is driven by input 850 and the inverse of input 850 which is generated by inverter 804. Pass gate 812 connects 802F with NAND 820; however, the polarity of the signals is arranged such that only one of pass gate 808 and 812 is presented to an input to 820 at a time. Pass gate 810 is configured so that it is always transparent and presents the output of 802E to NAND 822. The input signals 852 and 854 are fed through inverters 816 and 818 which are connected to NANDs 820 and 822. When the NAND is selected (by the output from the pass gate being held high) the input connected to the selected NAND is inverted again and passed to balanced NAND 824, the output of which is the multiplexer output. Balanced NAND 824 is designed to have similar propagation delays from its two inputs to its output to avoid adding a phase error depending on which input is selected.

Figure 9:
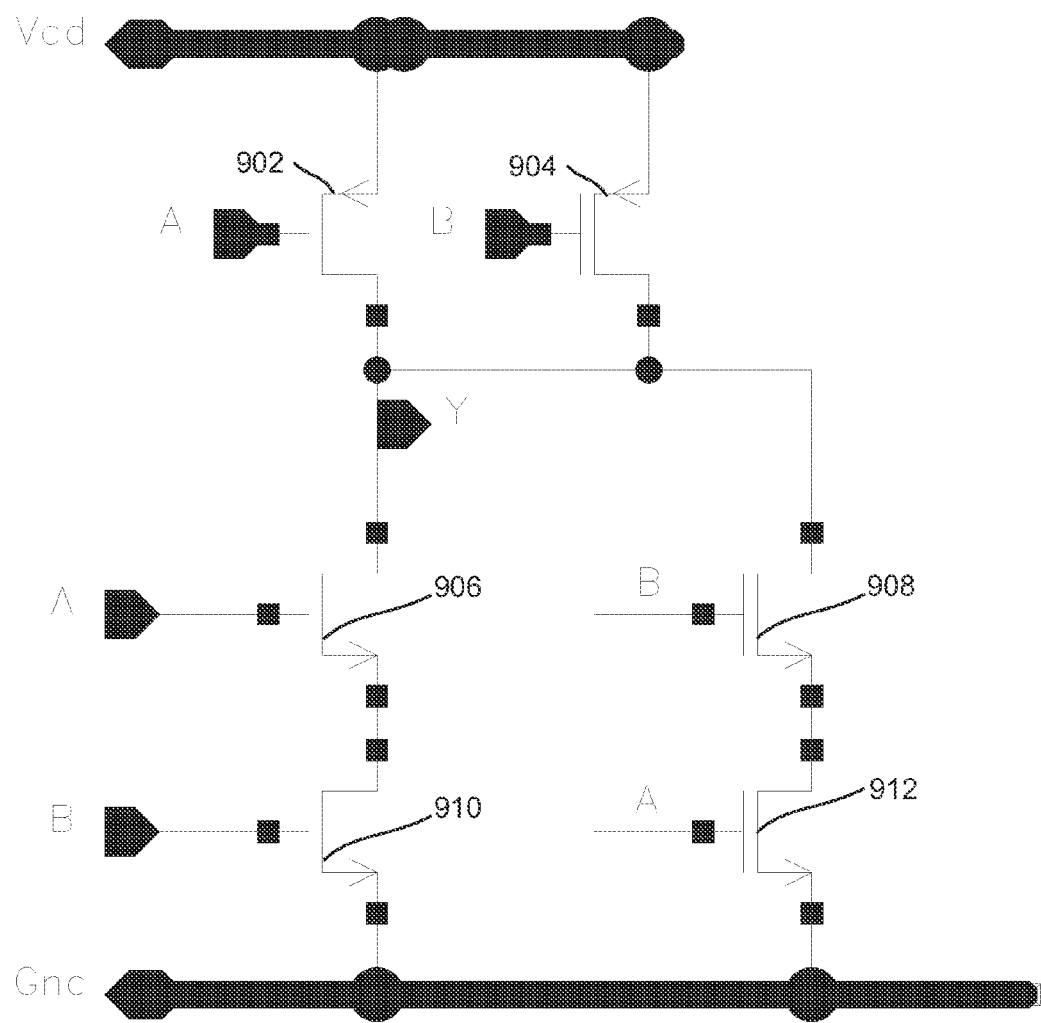
FIG. 9 is a schematic diagram illustrating an embodiment of a balanced logic gate.

FIG. 9 is a schematic diagram illustrating an embodiment of a balanced logic gate. In some embodiments, the PMOS devices 902 and 904 are arranged so that a transition on B or A has the same drive strength. Similarly, NMOS devices 906, 908, 910, and 912 are arranged so that the two parallel signal paths have the same drive strength, and that each input drives both an inner and an outer NMOS. This arrangement is done because the NMOS devices that are coupled directly to the output node generally have a lower propagation delay than NMOS devices that are not directly coupled to the output node.

Figure 10:
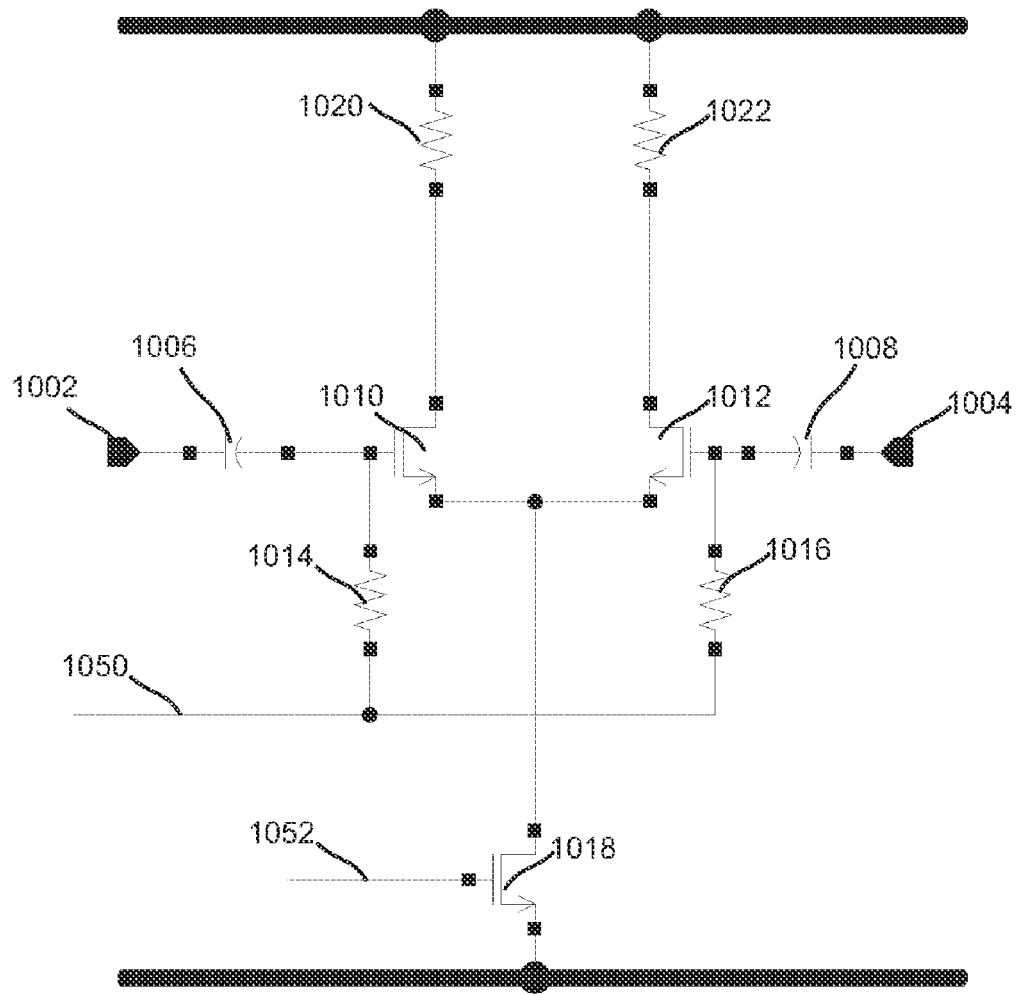
FIG. 10 is a schematic diagram illustrating an embodiment of a duty-cycle stabilizer.

FIG. 10 is a schematic diagram illustrating an embodiment of a duty-cycle stabilizer. In some embodiments a duty-cycle stabilizer is placed between the VCO and the multiplexer. Inputs 1002 and 1004 are coupled to the VCO. Blocking capacitors 1006 and 1008 combined with bias resistors 1014 and 1016 couple the AC component of the VCO to the differential pair comprising NMOS 1010 and NMOS 1012 while providing a DC bias level within the operating range of the amplifier. The DC bias level is set by applying a voltage to 1050. Current source transistor 1018 provides a tail current to the differential pair and is biased in a normal fashion by applying a voltage to its gate 1052. The output of the duty-cycle stabilizer is taken from the transistor side of load resistors 1020 and 1022. Because the differential amplifier shown is principally sensitive to the differential input and generally rejects a common mode input signal the output of the duty-cycle stabilizer provides improved duty cycle, meaning closer to 50%, and phase alignment. In some embodiments, additional circuits are used to convert the output of the duty cycle stabilizer to rail to rail digital signal before the multiplexer.

Figure 11:
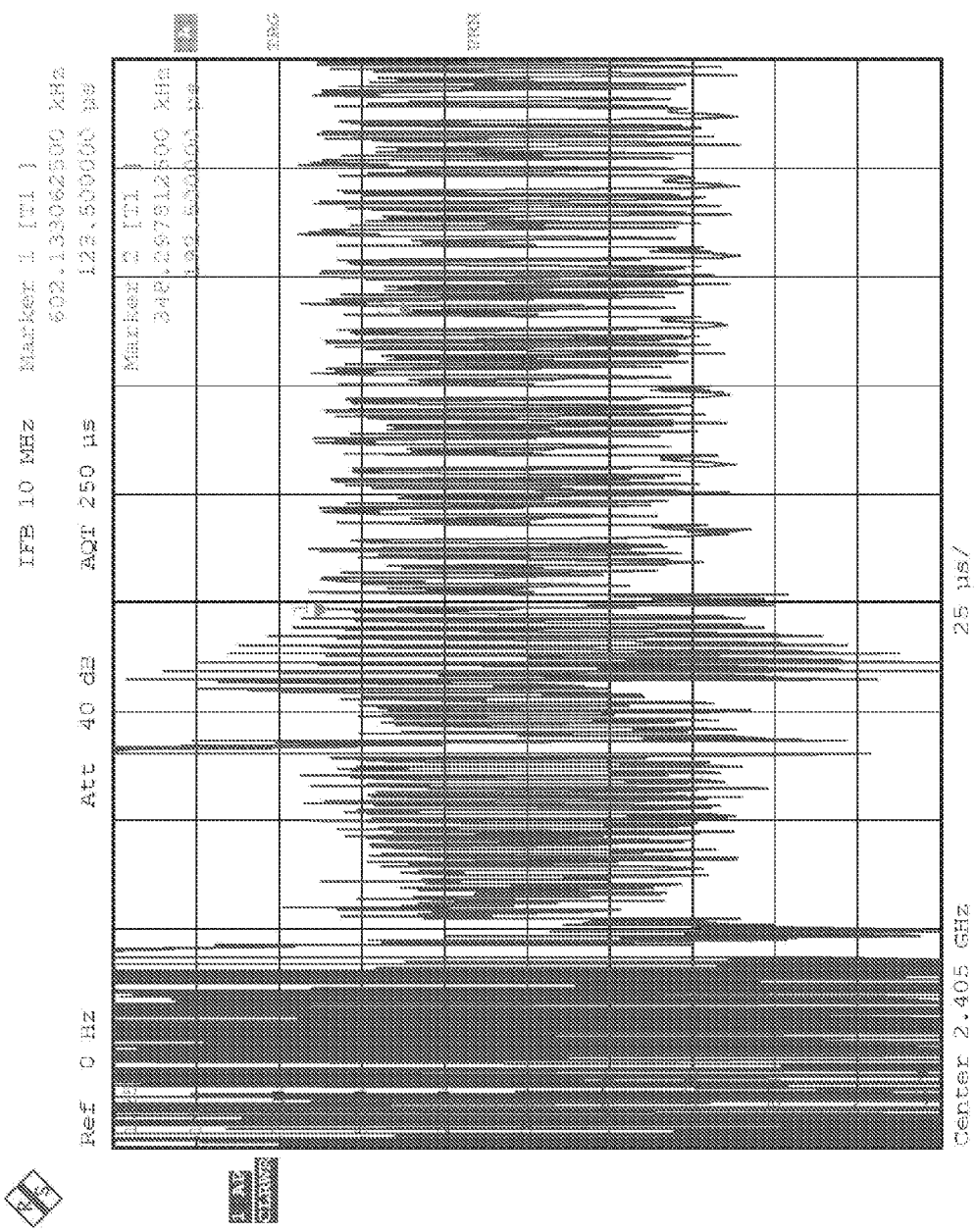
FIG. 11 illustrates a measured frequency versus time plot of one embodiment of a modulator.

FIG. 11 illustrates a measured frequency versus time plot of one embodiment of a modulator in which the common-mode loop is started first, followed by enabling the differential-mode loop, and finally ramping up the power-amplifier. In the example shown, starting from the left axis, the modulator is shown first settling to the channel center frequency or common-mode frequency. After settling for about 40 us the differential-mode loop is enabled. The deviation frequency can be seen to start off smaller then desired and then grow to the correct value. After about 60 us of differential mode settling the PA is ramped up. Enabling the PA causes a short disturbance in the frequency which is small enough in frequency and amplitude so as not to cause regulatory compliance issues. The modulator and PA are completely settled by 125 us at which point a packet is sent out starting with a preamble. During startup, a chip training sequence equal to [1,1,0,0,1,1,0,0] is used to speed settling of the feedback loops. In various embodiments, a different or no special training sequence is used, or any other appropriate sequence. Note that in various embodiments the loop gain can be increased, decreased, or kept the same in various phases of settling depending on the particular application. In some embodiments, loop gain is adjusted by changing the charge pump current. In some embodiments, differential-mode, common-mode, or both differential- and common-mode loop gain is reduced after settling is complete for various reasons including reduced power consumption.

Figure 12:
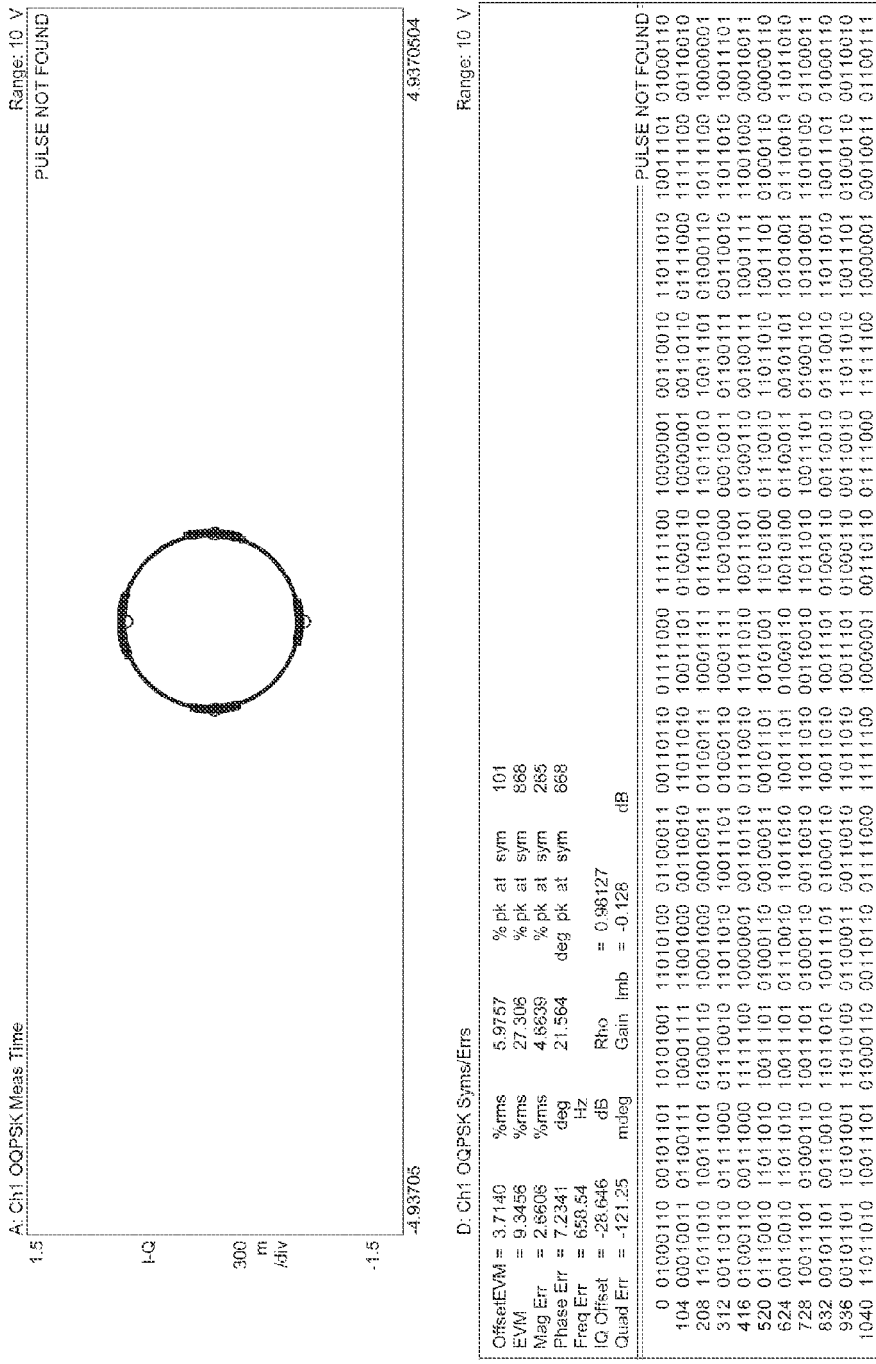
FIG. 12 illustrates measured error vector magnitude of one embodiment of a modulator.

FIG. 12 illustrates measured error vector magnitude of one embodiment of a modulator. In some embodiments, the modulator modulates O-QPSK with half sine pulse shaping according to IEEE 802.15.4-2003. The measured root-mean-square EVM as specified in the IEEE 802.15.4-2003 specification is 9.34%, which is well below the maximum allowable value of 35%.

In various embodiments, varactors comprise a junction varactor, a gate-oxide varactor, a digital varactor, or any other appropriate varactor. While the varactors have been shown as differential they may also be single-ended. In some embodiments, a single-ended varactor comprises a single varactor.

In various embodiments, signal paths shown or described are differential or single ended.

In some embodiments, a Gaussian or other shaped phase- or frequency-modulation format is transmitted. In some embodiments the proper trajectory for shaped phase- or frequency-modulation is effected by placing a filter between the differential charge pump output and the differential varactors so that when the differential-varactors are switched from the first polarity to the second polarity the voltage on the varactors follows the desired voltage-versus-time characteristic.

In some embodiments, a shaped voltage-versus-time characteristic is achieved by stepping a digital input between a first state to a second state along a defined trajectory, the digital input being connected to a ratiometric digital-to-analog (DAC) converter. In some embodiments the ratiometric DAC uses as a reference the outputs of a differential amplifier or charge pump filter similar to 220. Ratiometric DAC design is well known by those skilled in the art and may use a resistor network combined with switches. By digitally controlling the DAC to generate voltages the desired voltage-pulse shaping may be attained. The generated voltage output is in turn connected to varactors which create the desired phase or frequency trajectory of the VCO.

In some embodiments, the phase- or frequency-modulation trajectory is achieved by using multiple varactors and switching voltage on these varactors to create the trajectory. In some embodiments there are two sets of varactors each with three varactor pairs. All the varactors of the first set are connected to the positive voltage polarity, while all the varactors of the second set are connected to the negative voltage polarity. To create a near continuous phase or frequency trajectory, some of the varactors in the first set are switched to negative voltage and some of the varactors in the second set are switched to positive voltage. Switching continues until all the first set varactors are negative and all the second set varactors are positive.

In some embodiments, more complicated modulation formats such as 8-PSK or 4-FSK are used. In some embodiments additional varactors are used for modulation. In some embodiments an additional set of properly-sized differential varactors are placed in parallel with the differential varactors so that the differential charge pump voltage properly controls the modulation frequencies for a 4-FSK modulation scheme in conjunction with switches that switch connections between the additional varactors and the differential charge pump output and switches that switch connections between the differential varactors and the differential charge pump output.

In some embodiments, the ratio of chips to the reference clock frequency is different than 2, for example, if a modulation index of 0.25 was desired 4 chips could elapse between reference edge comparisons. In some embodiments the number of chips elapsing between reference edge comparisons varies depending on the data being sent and varies throughout a data stream or packet. In some embodiments, the chip edge is sampled at a non constant rate so that the feedback to differential and common mode loops occurs more orthogonally, for example the reference clock could be compared and then compared again after 4 chips, then again after 2 more chips, then again after 5 chips.

In some embodiments, phase shifting of an edge is generated by an optional delay-locked loop (DLL) 430 which is locked to the VCO (e.g., VCO 404). A DLL can provide an edge that is delay locked 180 degrees out of phase at the VCO frequency. The properly phase-shifted edge may be selected by a multiplexer (e.g., multiplexer 408) attached to the DLL phase-delayed outputs and fed to the VCO counter (e.g., counter 410) to align the divided-down VCO with the reference clock, compensating for the expected location of the phasor due to modulation. In some embodiments, a DLL has four or more output phases of the VCO to attain finer phase granularity such as 90 degree granularity or even 45 degree or lower granularity; this enables the feedback loops to operate at more points along the full 360 degrees of the I-Q plot. Lower phase granularity is particularly desirable when a more complicated modulation format such as 8-PSK is utilized. In some embodiments, the VCO is delayed by a DLL before entering a divider. In various embodiments, a divider output or the reference clock is delayed by a replica DLL where the bias of the delay elements of the replica DLL is determined by a DLL that runs off of the VCO. A DLL can provide a time-delayed edge of a divider output or of a reference clock. The time delay of the edge has a known, selectable phase delay; for example, the edge may be delayed for a period of time equivalent to 0 or 180 degrees of the VCO. The properly phase-shifted edge may be selected by a multiplexer attached to the DLL phase-delayed outputs and fed to the phase-frequency detector, compensating for the expected location of the phasor due to modulation.

In some embodiments modulation, is accomplished using a varactor by setting the voltage on a first varactor terminal and then swinging a second varactor terminal from a first constant voltage to a second constant voltage. The differential-mode feedback loop adjusts the magnitude of the shift of frequency by setting the voltage on the first varactor terminal.

In some embodiments two feedback loops are used to control a high frequency and a low frequency. In this embodiment there are two feed back loops and the loops directly control two voltages used to control the VCO. One voltage sets the fast coding frequency and the second voltage sets the slow coding frequency. The loops alternate operation depending on whether the fast or slow chip coding is presently transmitted. The two voltages may be multiplexed to a varactor or differential varactor via a multiplexer or a switch consistent with the desired output chip stream.

In some embodiments, to save power, the feedback paths are disabled after the modulation and center frequency has stabilized and the modulator operates open-loop for the remainder of a packet.

In some embodiments, trim is included to compensate for systematic or random mismatch in the modulation characteristic. Mismatch may arise from layout or manufacturing variations and can cause a degradation in EVM. Trim of duty-cycle error may be achieved by including a driver (e.g., a buffer or inverter) with a variable delay between the counter and the PFD. Trim operates by varying the delay between a first value and a second value depending on which VCO edge is referenced for the phase comparison (e.g., 0 or 180 degrees). Delay is adjusted by varying the loading on the driver output. In some embodiments, delay is adjusted digitally by adjusting the voltage between one of two values for each of a plurality of varactors in a trim array depending on which edge is referenced for the phase comparison. In some embodiments, delay is adjusted digitally by switching in and switching out capacitors depending on which edge is referenced for the phase comparison. Adjusting capacitive loading of the driver has the effect of adjusting propagation delay. In some embodiments, duty-cycle trim is adjusted farther upstream in the signal path, for example by adjusting capacitive loads applied to the outputs of the duty-cycle stabilizer. In some embodiments, charge-pump offset is trimmed. In some embodiments, a charge-pump offset is trimmed by using a DAC to adjust current mismatch (for example, by trimming current sources) between the two legs in a differential charge pump.

Figure 13:
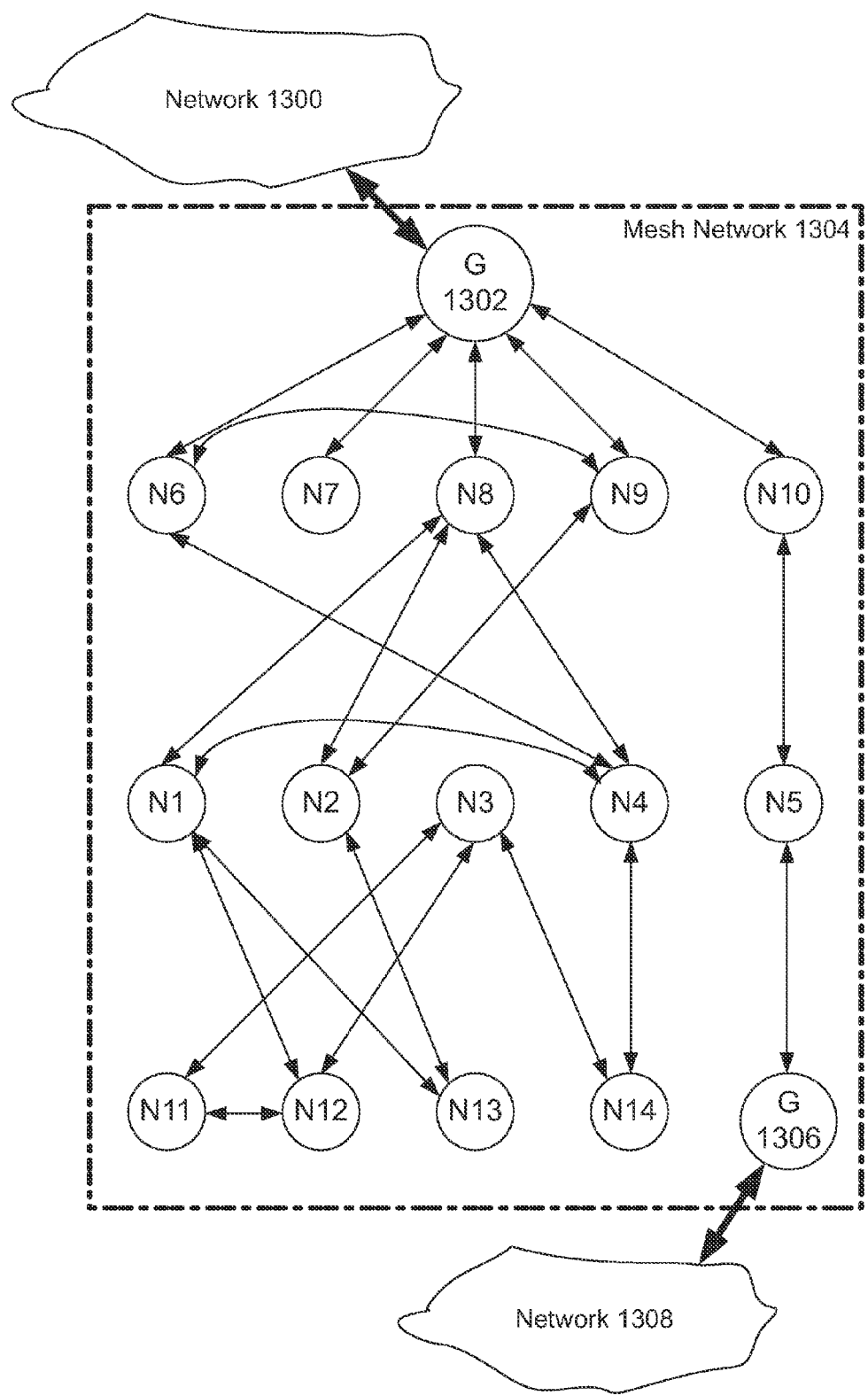
FIG. 13 is a block diagram illustrating an embodiment of a mesh network.

FIG. 13 is a block diagram illustrating an embodiment of a mesh network. In the example shown, mesh network 1304 can communicate with network 1300 and/or network 1308. Network 1300 and network 1308 comprise communication networks. In various embodiments, network 1300 and/or network 1308 comprise(s) a local area network, a wide area network, the Internet, a wired network, a wireless network, or any other appropriate communication network. Mesh network 1304 includes gateway nodes and mesh network nodes. Gateway nodes are represented in FIG. 1 as G 1302 and G 1306. The gateway nodes are able to communicate directly with a network—for example, network 1300 and network 1308, respectively—and with mesh network nodes. For example, G 1302 is able to directly communicate with N6, N7, N8, N9, and N10. In some embodiments, the gateway node acts as a mesh network coordinator sending to and receiving from the mesh network nodes information, configuration, status updates, etc. In some embodiments, there are multiple gateway nodes that can communicate with the same network (e.g., network 1300) or one or more different networks. Mesh network nodes are represented in FIG. 13 as N1-N14. A mesh network node can communicate with other mesh network nodes and gateway nodes. In some embodiments, mesh network nodes are sensor or device mesh network nodes. For example, mesh network node N5 is able to communicate directly with mesh network node N10 and with gateway node G 1306. In various embodiments, the connections allow communication only in one direction (i.e., to a node or from a node) or in both directions (i.e., both to and from a node).

In the example shown in FIG. 13, gateway and mesh network nodes communicate via radio transmitters and receivers using a packet. In various embodiments, a packet includes a header section and a data section. In various embodiments, the packet header includes information regarding packet type, time sent, source node, destination node, associated frame, node health, number of tries for a hop, number of hops, etc. The packets are sent during defined time slots on defined frequencies using a time division multiple access (TDMA) methodology.

Figure 14:
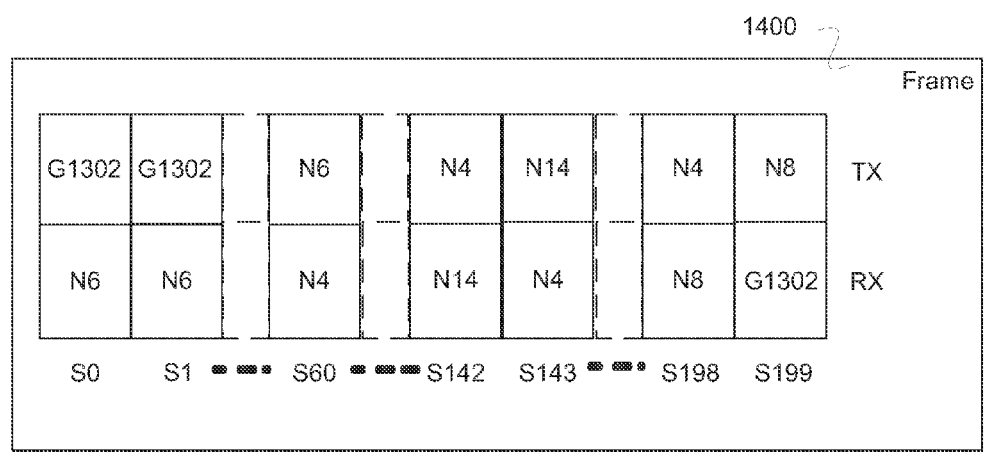
FIG. 14 is a block diagram illustrating an embodiment of a frame.

FIG. 14 is a block diagram illustrating an embodiment of a frame. In the example shown, frame 1400 includes time slots that are used to designate a receiver and transmitter. During the time slot a designated transmitter node transmits to a designated receiver node of a mesh network. In various embodiments, the frequency used for transmission and reception is fixed, is selected from a pool of frequencies, rotates in a fixed manner, is randomly assigned, is assigned in a predetermined sequence, is assigned using a predetermined algorithm, or any other appropriate manner of assigning frequency to a transmission and reception. In various embodiments, the frequency comprises a frequency in the industrial, scientific, and medical (ISM) radio band from 902 MHz to 928 MHz, or the ISM band from 2.4 GHz to 2.4835 GHz. Frame 1400 is repeated after executing the transmissions/receptions for all of its time slots. The network can support several different frames either running at different times or running concurrently. Some frames have only a few slots while some have many slots depending on their design. Frame 1400 contains 200 time slots (represented by S0, S1, S60, S142, S143, S198, and S199). Transmission links in the mesh network are assigned cells in a frame during which then can communicate. The transmissions and receptions for the frame are represented by designating a transmitter and a receiver for a given time slot. In S0 and S1, gateway G1302 sends to node N6. In S60, node N6 sends to node N4. In S142, node N4 sends to node N14. In S143, node N14 sends to node N4. In S198, node N4 sends to node N8. In S199, node N8 sends to gateway G1302. In some embodiments, the frame is developed by a gateway or managing node during setup or acquisition of nodes in the mesh network. In various embodiments, slots include one-to-one communication relationships wherein one node broadcasts to a single node; one-to-many communication relationships wherein one node broadcasts to a plurality of nodes; many-to-one communication relationships wherein one of a selected set of nodes may transmit to a single node; and many-to-many communication relationships wherein one of a selected set of nodes may transmit to a plurality of nodes.

Figure 15:
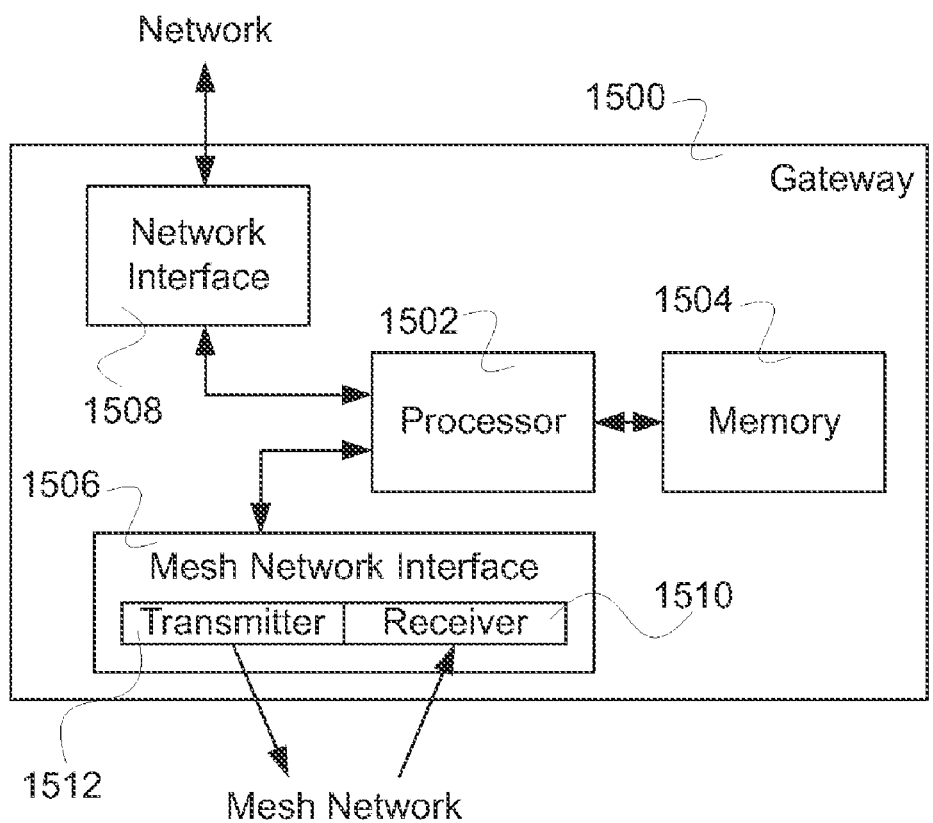
FIG. 15 is a block diagram illustrating an embodiment of a gateway of a mesh network.

FIG. 15 is a block diagram illustrating an embodiment of a gateway of a mesh network. In some embodiments, the gateway 1500 of FIG. 15 is used to implement G 1302 and/or G 1306 in FIG. 13. In the example shown, gateway 1500 includes processor 1502, memory 1504, mesh network interface 1506, and network interface 1508. Processor 1502 runs software that when executed manages the mesh network. Management of the mesh network can include network setup, adding nodes, removing nodes, adding frames to the network, removing frames, monitoring status, optimizing network performance by reconfiguring frames, time synchronization, and/or any other appropriate network management function. Memory 1504 provides storage for processor 1502 including run-time storage and instruction storage. Mesh network interface 1506 includes receiver 1510 and transmitter 1512. Receiver 1510 receives communications in the form of packets transmitted from the mesh network. Transmitter 1512 transmits communications in the form of packets to the mesh network. Network interface 1508 communicates with a communication network comprising of one or more devices. Information from the mesh network is passed directly to or processed by gateway 1500 using processor 1502 before passing to the communication network. In some embodiments, gateway 1500 is line powered so that power limitations due to finite battery reserves are not an issue. In various embodiments, network management is accomplished by a remote application or is coordinated by a node in the network.

Figure 16:
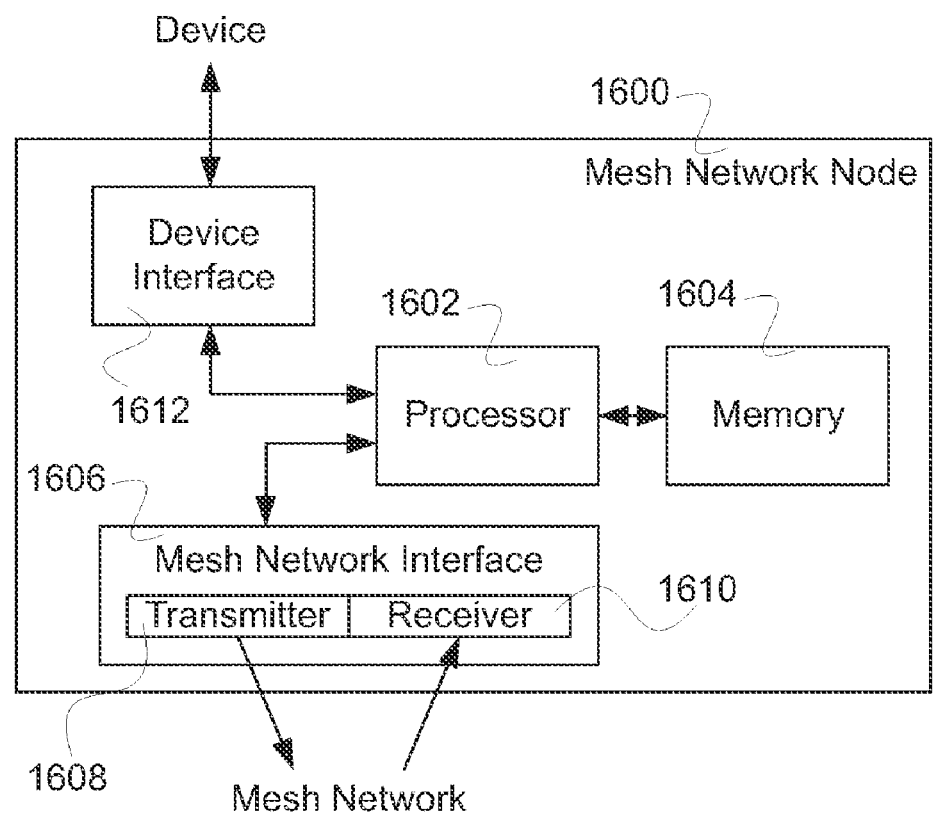
FIG. 16 is a block diagram illustrating an embodiment of a mesh network node of a mesh network.

FIG. 16 is a block diagram illustrating an embodiment of a mesh network node of a mesh network. In some embodiments, the mesh network node 1600 of FIG. 16 is used to implement nodes N1-N14 in FIG. 13. In the example shown, mesh network node 1600 includes processor 1602, memory 1604, mesh network interface 1606, and device interface 1612. Processor 1602 runs software that when executed operates the mesh network node. Operation of the mesh network node includes setup, receiving messages, transmitting messages, adding capacity, removing capacity, providing status reports to a gateway manager such as gateway 1500 in FIG. 15, time synchronization, and/or any other appropriate operating function. Memory 1604 provides storage for processor 1602 including run-time storage and instruction storage. Mesh network interface 1606 includes receiver 1610 and transmitter 1608. Receiver 1610 receives communications in the form of packets transmitted from the mesh network. Transmitter 1608 transmits communications in the form of packets to the mesh network. In some embodiments, mesh network node 1600 is battery powered so that power limitations due to finite battery reserves are an issue. Device interface 1612 communicates with a device and/or sensor. Device and/or sensor types that can be connected to mesh network node include temperature sensors, strain sensors, image sensors, vibration sensors, fluid level sensors, chemical sensors, gas sensors, radiation detectors, position sensors, acceleration sensors, inclination sensors, shock sensors, infrared sensors, sound sensors, current sensors, voltage sensors, switching device, actuator device, or any other appropriate device and/or sensor. Information to/from the sensor and/or device is passed directly to or processed by sensor mesh network node 1600 using processor 1602 before passing from/to the mesh network. In some embodiments, mesh network node 1600 is compatible with IEEE standard 802.15.4. IEEE 802.15.4 standard relates to low rate wireless personal area networks.

In some embodiments a modulator as described herein is used in transmitter 1512 or transmitter 1608.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A modulator for modulating a radio frequency signal comprising:
   a voltage-controlled oscillator having an output;
   a reference clock;
   a divider coupled to the voltage-controlled oscillator output and having an output;
   a detector coupled to the divider output and the reference clock, the detector having an output;
   a first feedback path coupled between the detector output and the voltage-controlled oscillator;
   a second feedback path coupled between the detector output and the voltage-controlled oscillator; and
   a chip encoder coupled in the second feedback path between the detector output and the voltage-controller oscillator, and having a data input terminal receiving a modulator input signal.

2. The modulator as in claim 1, wherein the first feedback path is configured to stabilize a center frequency and the second feedback path is configured to stabilize a modulation characteristic.

3. The modulator as in claim 2, wherein the modulation characteristic is a frequency deviation.

4. The modulator as in claim 1, further including a multiplexer coupled between the voltage-controlled oscillator and the divider.

5. The modulator as in claim 4, further including a duty-cycle stabilizer coupled between the voltage-controlled oscillator and the multiplexer.

6. The modulator as in claim 4, wherein the multiplexer multiplexes between a first phase of the voltage-controlled oscillator and a second phase of the voltage-controlled oscillator.

7. The modulator as in claim 1, wherein the first feedback path is configured to stabilize a lower frequency and the second feedback path is configured to stabilize a higher frequency.

8. The modulator as in claim 1, wherein the detector comprises a phase detector or a phase frequency detector.

9. The modulator as in claim 3, wherein the modulation is compliant with Institute of Electrical and Electronics Engineers specification 802.15.4-2003.

10. The modulator as in claim 1, wherein the voltage-controlled oscillator further comprises a differential varactor.

11. The modulator as in claim 1, wherein the voltage-controlled oscillator is coupled to an amplifier.

12. The modulator as in claim 1, wherein a training sequence is applied to the data input terminal.

13. The modulator as in claim 4, wherein the multiplexer switches between a first state and a second state to center the modulator at a desired channel.

14. The modulator as in claim 1, wherein the first feedback path closes a first feedback loop and the second feedback path closes a second feedback loop and the bandwidth of the first feedback loop and the second feedback loop are both slower than the rate at which data is applied to the data input terminal.

15. The modulator as in claim 1, further including a delay locked loop coupled to the voltage controlled oscillator.

16. The modulator as in claim 2, wherein the modulation characteristic is trimmed to achieve a desired EVM specification.

17. The modulator as in claim 1, wherein the second feedback path includes a multiplier, wherein the multiplier dynamically adjusts the polarity of a signal depending on the bit sequence sent.

18. The modulator as in claim 1, further comprising:
   a multiplexer coupled to the output of the voltage-controlled oscillator, the multiplexer having a first input, a second input, a select input, and an output,
   wherein an input of the divider circuit is coupled to the output of the multiplexer, such that the input of the divider circuit is coupled to the voltage-controlled oscillator through the multiplexer, and
   wherein the multiplexer output is controlled to toggle at a frequency as high as an oscillation frequency of the voltage-controlled oscillator when the select input is held at a constant value.

19. The modulator as in claim 1, wherein the first feedback loop path comprises a first charge pump,
   wherein the second feedback path comprises a second charge pump, and
   wherein at least one of the first and second feedback paths further comprises at least one varactor.

20. The modulator as in claim 19, wherein the first feedback path is controlled using a first set of two or more varactors.

21. The modulator as in claim 19, wherein the second feedback path is controlled using a second set of two or more varactors.

22. The modulator as in claim 19, further comprising a unit for disabling the first and second feedback paths after a period of time of simultaneous operation.

23. A modulator for modulating a radio frequency signal comprising:
   a voltage-controlled oscillator having an output;
   a reference clock;
   a data input terminal;
   a multiplexer coupled to the voltage-controlled oscillator;
   a divider coupled to the multiplexer;

a detector coupled to the divider output and the reference clock, the detector having an output;
a first feedback path coupled between the detector output and the voltage-controlled oscillator;
a second feedback path coupled between the detector output and the voltage-controlled oscillator; and
a chip encoder coupled in the second feedback path between the detector output and the voltage-controlled oscillator,
wherein the data input terminal is coupled to the voltage-controlled oscillator via the chip encoder.

* * * * *